US006322848B1

(12) United States Patent
Phenis et al.

(10) Patent No.: US 6,322,848 B1
(45) Date of Patent: Nov. 27, 2001

(54) FLEXIBLE EPOXY ENCAPSULATING MATERIAL

(75) Inventors: Michael T. Phenis, Elwood; Manny Tavares, Fishers, both of IN (US)

(73) Assignee: Lord Corporation, Cary, NC (US)

( * ) Notice: Subject to any disclaimer, the term of this patent is extended or adjusted under 35 U.S.C. 154(b) by 0 days.

(21) Appl. No.: 09/426,483

(22) Filed: Oct. 26, 1999

(51) Int. Cl.[7] .............................. C08L 63/04; C08L 63/00; C08L 9/02
(52) U.S. Cl. ......................... 427/58; 428/413; 438/127; 525/113; 525/122; 525/482; 525/484
(58) Field of Search ..................................... 525/482, 484, 525/113, 122; 427/58; 438/127; 428/413

(56) References Cited

U.S. PATENT DOCUMENTS

| 4,348,505 | * | 9/1982 | Di Benedetto . |
| 4,657,992 | * | 4/1987 | Brennan . |
| 4,788,268 | * | 11/1988 | Lau . |
| 4,798,761 | | 1/1989 | Wykowski et al. . |
| 4,855,333 | | 8/1989 | Rudik et al. . |
| 5,006,614 | | 4/1991 | Itoh et al. . |
| 5,025,068 | * | 6/1991 | Garcia . |
| 5,061,779 | * | 10/1991 | Wang . |
| 5,302,666 | * | 4/1994 | Hino . |
| 5,708,056 | | 1/1998 | Lindley et al. . |
| 5,907,333 | * | 5/1999 | Patil . |

FOREIGN PATENT DOCUMENTS 6-220164    8/1994   (JP) .

* cited by examiner

*Primary Examiner*—David J. Buttner
(74) *Attorney, Agent, or Firm*—Miles B. Dearth

(57) ABSTRACT

A flexible encapsulating material resulting from a mixture that includes at least one epoxy novolak resin and at least two other epoxy compounds wherein the material has a percent hardness change of less than 20% after thermal aging of 504 hours at 140° C. The epoxy novolak resin preferably has less than 3 epoxy groups per molecule. A further embodiment is an electronic component encapsulated with a flexible material resulting from combining a two part system wherein a first part includes an epoxy novolak resin and at least two other epoxy resins and the second part includes at least one amine. An additional embodiment is a method for flexibly encapsulating an electronic component comprising applying to the component a mixture comprising an epoxy novolak resin having less than 3 epoxy groups per molecule and at least one other epoxy compound.

22 Claims, No Drawings

FLEXIBLE EPOXY ENCAPSULATING MATERIAL

BACKGROUND OF THE INVENTION

The present invention relates to an epoxy encapsulating material that has unique flexibility characteristics.

Electronic components often must operate under severe or harsh environments such as in automotive, marine and aerospace applications. In order to protect these sensitive components they often are coated with a protective encapsulating material.

It is known to use various epoxies as flexible encapsulating materials for electronic components. Encapsulating materials can be exposed to continuous temperatures of up to about 140° C. and intermittent temperatures of up to about 150° C. Such exposure is referred to herein as "thermal aging". However, the known epoxies such as EPOLITE FH-1432 commercially available from H.B. Fuller Co. and XN-2248 Resin/XY-2233-1 Hardener commercially available from Nippon Pelnox Corporation exhibit substantial increases in hardness and modulus with thermal aging. For example, according to measurements obtained by the present inventors, EPOLITE FH-1432 has a flexural modulus of 1111.6 measured at −40° C. after thermal aging of 504 hours at 140° C. and a percent hardness change of 30.77 percent after thermal aging of 504 hours at 140° C. and XN-2248 Resin/XY-2233-1 Hardener has a flexural modulus of 850.2 measured at −40° C. after thermal aging of 504 hours at 140° C. and a percent hardness change of 32.30 percent after thermal aging of 504 hours at 140° C.

Failures occur because of stress induced on an electronic component over time due to changes that occur in the encapsulating material's mechanical properties or viscoelastic properties. These changes occur during thermal cycling and will induce extreme pressure on electronic components. Below −20° C., the conventional chemistry for flexible epoxies causes them to become very rigid and have very high modulus. Also, the hardness of these materials increases dramatically when exposed to high temperatures of 130° C. or more for any length of time. This is due to the additional crosslinking of the epoxy resin and curative. This combination of limited glass transition temperature, very high modulus below the Tg and thermal age hardening causes poor thermal cycle performance and dramatically increases stress on electronic components. The varying stress fatigues the solder or the component itself and eventually causes an open circuit or a short. Consequently, it would be very advantageous to have an epoxy encapsulating material that continues to exhibit flexibility after thermal aging.

SUMMARY OF THE INVENTION

There is provided according to the present invention a flexible encapsulating material resulting from a mixture that includes at least one epoxy novolak resin and at least two other epoxy resins wherein the material has a percent hardness change of less than 20% after thermal aging of 504 hours at 140° C. According to another embodiment of the invention there is provided a flexible encapsulating material resulting from a mixture comprising an epoxy novolak resin having less than 3 epoxy groups per molecule and at least one other epoxy resin. The encapsulating material is used to encapsulate electronic components.

An important feature of the invention is the superior properties exhibited by the cured encapsulating material are maintained even after long term or intermittent exposure to high temperatures. The cured material imparts very low stress on electronic components due to its robust flexibility. In particular, the cured material can exhibit a percent hardness change of less that 20%, preferably less than 10%, after thermal aging of 504 hours at 140° C. In addition, the cured material has a flexural modulus of less than 1100 MPa, preferably less than 450 MPa, measured at −40° C. after thermal aging of 504 hours at 140° C., and a Tg of less than −40° C., preferably less than −55° C. The flexibility properties of the material invention distinguish it from hard molded epoxy encapsulated materials.

DETAILED DESCRIPTION OF THE PREFERRED EMBODIMENTS

Unless otherwise indicated, description of components in chemical nomenclature refers to the components at the time of addition to any combination specified in the description, but does not necessarily preclude chemical interactions among the components of a mixture once mixed.

While not being bound by any theory, it is believed that the epoxy novolak performs two key roles in the system of the invention. It unexpectedly dramatically increases the tensile and tear strength of the cured material without adversely effecting the low hardness, low Tg or low modulus. This increase in strength without an adverse property effect is surprising since an epoxy novolak typically is used to produce a very hard, high Tg material due to its highly functional structure. It also surprisingly acts as a catalyst to improve the cure rate of the composition at elevated temperatures. Consequently, amines (such as diethylenetriamine, triethylenetetramine and tetraethylenepentamine) that typically would be used as catalysts but are known to adversely effect thermal aging characteristics can be avoided.

Epoxy novolaks are well known materials that typically are made by reacting an epoxy-containing compound with a novolak. The novolak can be made from a variety of phenolic compounds such as phenol, cresol and other substituted phenols. It has been found that epoxy novolaks having less than 3, preferably less than 2.5, epoxy groups per molecule are particularly effective. The "average" number of epoxy groups per molecule is determined by dividing the total number of epoxy groups in the epoxy-containing material by the total number of epoxy molecules present. A particularly useful epoxy novolak is 1,4-butanediol diglycidyl ether of phenolformaldehyde novolak (such as those available under the tradenames DEN-431 and DEN-438 from Dow Chemical Co.).

The amount of epoxy novolak that is present can be 1 to 15, preferably 5 to 10, weight percent, based on the total amount of epoxy compounds in the composition. If the epoxy novolak is present in an amount greater than 15 weight percent the hardness, modulus and Tg would increase undesirably. If the epoxy novolak is present in an amount less than 1 weight percent, the tensile strength and tear strength would decrease undesirably and cure time would increase undesirably.

In addition to the epoxy novolak, the invention includes at least one other epoxy compound. The additional epoxy compound(s) should be present because they provide the desired flexibility, Tg and modulus. If only an epoxy novolak is present these properties would be too high.

It is especially useful to include at least one mono-epoxy functional ingredient and at least one di- or poly-epoxy functional ingredient. The mono-epoxy functional ingredient adds exceptional flexibility to the cured material, but is relatively slow curing. The di- or poly-epoxy functional ingredient adds chemical and moisture resistance, thermal stability and flexibility.

The additional epoxy ingredient(s) include monomeric epoxy compounds and epoxies of the polymeric type and can be aliphatic, cycloaliphatic, aromatic or heterocyclic. These materials generally have, on the average, at least 1.5, preferably at least 2 polymerizable epoxy groups per molecule. The polymeric epoxies include linear polymers having terminal epoxy groups (for example, a diglycidyl ether of a polyoxyalkylene glycol), polymer skeletal oxirane units (for example, polybutadiene polyepoxide) and polymers having pendant epoxy groups (such as a glycidyl methacrylate polymer or copolymer). The epoxies may be pure compounds but are generally mixtures containing one, two or more epoxy groups per molecule. The molecular weight of the epoxy compound may vary from 130 to 4,000 or more. Mixtures of various epoxy compounds can be used.

Epoxy-containing materials that are particularly useful include those based on glycidyl ether monomers of the formula:

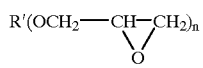

where R' is alkyl or aryl and n is an integer of 1 to 6. Examples are di- or polyglycidyl ethers of polyhydric phenols obtained by reacting a polyhydric phenol with an excess of chlorohydrin such as epichlorohydrin. Such polyhydric phenols include resorcinol, bis(4-hydroxyplheniyl)methaiie (known as bisphenol F), 2,2-bis(4-hydroxyphenyl)propane (known as bisphenol A), 2,2-bis(4'-hydroxy-3',5'-dibromophenyl)propane, 1,1,2,2-tetrakis(4'-hydroxyphenyl)ethanie. Examples of this type are described in U.S. Pat. No. 3,018,262 and in "Handbook of Epoxy Resins" by Lee and Neville (McGraw-Hill Book Co. 1967), both incorporated by reference. Other examples include di- or polyglycidyl ethers of polyhydric alcohols such as 1,4-butanediol, or polyalkylene glycols such as polypropylene glycol, di- or polyglycidyl ethers of cycloaliphatic polyols such as 2,2-bis(4-hydroxycyclohexyl)propane, triglycidyl ether of castor oil and diglycidyl ether of linoleic dimer acid. Other examples are monofunctional resins such as alkyl glycidyl ethers. Illustrative alkyl glyciyl etlhes include long carbon chain (at least 10 or 12 carbon atoms) aliphatic glycidyl ethers, cresyl glycidyl ether and butyl glycidyl ether.

The epoxy compounds may also be cycloaliphatic or alicyclic cpoxides. Examples of cycloaliphatic epoxides include diepoxides of cycloaliphatic esters of dicarboxylic acids such as bis(3,4-epoxycyclohexylmetlhyl)oxalate, bis (3,4-epoxycyclohexylmiietlhyl)adipate, bis(3,4-epoxy-6-methylcyclohexylmethyl)adipate, bis(3,4-epoxycyclohexylinethyl )pimelate; vinylcyclohexene diepoxide; limonene diepoxide; dicyclopentadiene diepoxide; and the like. Other cycloaliphatic epoxides include 3,4-epoxycyclohexyl methyl-3,4-epoxycyclohexane carboxylates such as 3,4-epoxycyclohexylmethyl-3,4-epoxycyclohexane carboxylate; 3,4-epoxy-1-methylcyclohexyl-methyl-3,4-epoxy-1-methylcyclohexane carboxylate; 6-methyl-3,4-epoxycyclohexyl methylmethyl-6-miietlhyl-3,4-epoxycycloliexane carboxylate; 3,4-epoxy-2-methylcyclohexylmethyl-3,4-epoxy-2-methylcyclohexane carboxylate; 3,4-epoxy-3-imethylcyclohexyl-methyl-3,4-epoxy-3-methylcyclohexane carboxylate; 3,4-epoxy-5-methylcyclohexyl-methyl-3,4-epoxy-5-methlylcyclohexane carboxylate and the like.

Another class of epoxy compounds are polyglycidyl esters and poly(β-methylglycidyl) esters of polyvalent carboxylic acids such as phtlhalic acid, terephthalic acid, tetralhydroplhthalic acid or hexahydrophthalic acid.

A further class of epoxy compounds are N-glycidyl derivatives of amines, amides and heterocyclic nitrogen bases such as N,N-diglycidyl aniline, N,N-diglycidyl toluidine, N,N,N',N'-tetraglycidyl bis(4-aminophenyl) methane, triglycidyl isocyanurate, N,N'-diglycidyl ethyl urea, N,N'-diglycidyl-5,5-dimethylhydantoin, and N,N'-diglycidyl-5-isopropylhydantoin.

Still other epoxy-containing materials are copolymers of acrylic acid esters of glycidol such as glycidylacrylate and glycidylmethacrylate with one or more copolyinerizable vinyl compounds. Examples of such copolymers are 1:1 styrene-glycidylmethacrylate, 1:1 methyl-methacrylateglycidylacrylate and a 62.5:24:13.5 methylmetlhacrylate-etliyl acrylate-glycidylmethacrylate.

The additional epoxy ingredients may be present in an amount such that they constitute the substantial weight of the side or part of the system that includes the epoxy ingredients. For example, the additional epoxy ingredients can be present in an amount of 99 to 50, preferably 95 to 75, weight percent based on the total amount of the epoxy-containing side.

The composition of the invention includes a catalyst or hardener for curing the epoxy ingredients. The hardener can be a nucleophilic substance such as an amine, a tertiary phosphine, quaternary ammonium salt with a nucleophilic anion, a quaternary phosphonium salt with a nucleophilic anion, an imidazole, tertiary arseniium salt with a nucleophilic anion and a tertiary sulfonium salt with a nucleophilic anion. Amine hardeners are preferred. Possible amine hardeners include aromatic amines, aliphatic amines, mondified polyamines, cycloaliphatic amines, amidoamines and various amine blends that are proprietary to others than the present inventors or assignee. Various mixtures of hardeners can be used.

Illustrative amines include methyidiethanolamine, triethanolamine, diethylamiiiopropylamine, benzyldiimethyl amine, m-xylylenedi(dimethylamine), N,N'-dimethylpiperazine, N-methylpyrrolidine, N-methyl hydroxypiperidine, N,N,N'N'-tetramethyldiaminioethaine, N,N,N',N',N'-pentamethyidiethylenetriamine, tributyl amilne trimethyl amine, diethyidecyl amine, triethylene diamine, N-methyl morpholine, N,N,N'N'-tetramethyl propane diamine, N-methyl piperidine, N,N'-diinethyl-1,3-(4-piperidino)propane, pyridine and the like. Aliphatic polyamines that are modified by adduction with epoxy resins, acrylonitrile or (methi)acrylates can also be utilized as amine catalysts. In addition, various Mannich bases can be employed as amine catalysts. Aromatic amines wherein the amine groups are directly attached to the aromatic ring can also be used. Particularly useful amine catalysts are amine terminated butadiene-acrylonitriles such as those commercially available from B.F. Goodrich under the trade designation HYCAR and proprietary blends of alkyl amines, polyoxypropylamines and alkyl phenols such as those commercially available from Shell Chemical under the trade designation EPI-CURE.

The material of the invention may include fillers such as carbon black or fumed silica in a relatively small amount (less than 10 weight percent based on the total weight of the composition), but does not typically include large amounts of fillers such as silica or alumina that are commonly found in hard molded epoxy encapsulating materials. Plasticizers, surfactants and other additives commonly used in encapsulating materials may also be included in the composition.

The invention preferably is formulated as a two part or pack system. The epoxy components typically are mixed into one side that is referred to herein as the "resin side". The amine hardener is mixed into the other side that is referred to herein as the "hardener side". The two parts are mixed together by means known in the art at the tine of use and then applied to the surface of an electronic component. As known in the art, the flow path around the electrical component can be controlled by dispensing the reactive mixture of the invention into a box or shell that contains the electrical component(s). It is important to note that a molding procedure is not used in order to apply the epoxy encapsulating material of the invention. When the amine hardener is mixed together with the epoxy components cure is initiated and continues resulting in a fully-cured flexible encapsulating material. Cure can occur at room temperature or by subjecting the material to heat such as up to 150° C. Heat curing will increase the speed at which cure occurs.

The ingredients of the invention can be mixed together by methods well known in the art. Each ingredient is introduced into the mixture for each side in the form of a liquid or paste (typically with relatively low to medium viscosities ranging from 10 to 1,000,000 cps at 25° C.). The resulting resin and hardener sides are liquids at room temperature that contain 100% solids (in other words, there are no solvents or inactive carrier fluids). The resin side may have a viscosity ranging from 100 to 600 cps at 25° C. and the hardener side may have a viscosity ranging from 3000 to 9000 cps at 25° C. The mixture of the resin side and the hardener side that is applied to the electronic component has an initial viscosity ranging from 500 to 2000 cps at 25° C.

The encapsulating material of the invention is useful for encapsulating a wide variety of electronic components including circuit boards that may contain integrated circuits, various resistors, capacitors, transistors and coils. In addition, switches, sensors or coils that may or may not be mounted on circuit boards can also be encapsulated with the material of the invention.

Non-limiting examples are provided below. In the examples the percent hardness change test is performed by measurinig the hardness of specimens of the cured material using a Shore durometer with the "OO" scale. The specimens then were placed in an oven at 140° C. for 504 hours. The specimens then were removed from the oven, allowed to cool to room temperature and the hardness was again measured. A smaller percent change indicates that the specimen has substantially retained its flexibility even after thermal aging. Tensile strength is measured by ASTM D-412 (Die C), tear strength is measured by ASTM D-624 (Die C) and % elongation is measured by ASTM D-412 (Die C).

EXAMPLE 1

A resin side was prepared by mixing together 20 weight percent diglycidyl ether of bisphenol A, 13 weight percent $C_{12}$–$C_{13}$ aliphatic glycidyl ether, 29 weight percent propoxylated glycerin triglycidyl ether, 29 weight percent triglycidyl ether of castor oil and 9 weight percent epoxy novolak having less than 3 epoxy groups per molecule. A hardener side was prepared by mixing together 80 weight percent oligomeric polyamine and 20 weight percent phthalate plasticizer. The resin side and hardener side were mixed together at a 1:1 volume mix ratio and an 80 gram mass was poured into a plastic shell. The specimens then were cured for fours hours at 80° C. The cured material had a flexural modulus of 1037.7 MPa at –40° C. after thermal aging, a Tg of –41.2° C., a percent hardness change of 19.4% after thermal aging for 504 hours at 140° C., a tensile strength of 66.6 psi, a percent elongation of 108% and a tear strength of 9.92 psi. The low modulus, Tg and percent hardness change indicate that the cured material is, and has remained, soft and flexible.

EXAMPLE 2

A resin side was prepared by mixing together 19 weight percent diglycidyl ether of bisphenol A, 5 weight percent $C_{12}$–$C_{13}$ aliphatic glycidyl ether, 55 weight percent propoxylated glycerin triglycidyl ether, 8 weight percent $C_{12}$–$C_{14}$ aliphatic glycidyl ether, 8 weight percent epoxy novolak having less than 3 epoxy groups per molecule and 5 weight percent phthalate plasticizer. A hardener side was prepared by mixing together 71 weight percent oligomeric polyaminie, 14 weight percent phthalate plasticizer and 15 weight percent amine terminated butadiene-acrylonitrile. The resin side and hardener side were mixed together at a 1:1 volume mix ratio and specimens prepared as in Example 1. The cured material had a flexural modulus of 412.4 MPa at –40° C. after thermal aging, a Tg of –56.14° C., a percent hardness change of 8.11% after thermal aging for 504 hours at 140° C., a tensile strength of 63.6 psi, a percent elongation of 122% and a tear strength of 10.7 psi. The low modulus, Tg and percent hardness change indicate that the cured material is, and has remained, soft and flexible.

What is claimed is:

1. A flexible encapsulating material resulting from a mixture comprising at least one epoxy novolak resin and at least two other epoxy compounds wherein the material has a percent hardness change of less than 20% after thermal aging of 504 hours at 140° C. and wherein said material has a flexural modulus of less than 1100 MPa measured at –40° C. after thermal aging of 504 hours at 140° C. and a Tq of less than –40° C.

2. A material according to claim 1 wherein the epoxy novolak resin has less than 3 epoxy groups per molecule.

3. A material according to claim 1 wherein the epoxy novolak is present in the mixture in an amount of 1 to 15 weight percent, based on the total amount of epoxy ingredients.

4. A material according to claim 1 wherein the material has a percent hardness change of less than 10% after thermal aging of 504 hours at 140° C.

5. A flexible encapsulating material resulting from a mixture comprising at least one epoxy novolak resin and at least two other epoxy compounds wherein the material has a percent hardness change of less than 20% after thermal aging of 504 hours at 140° C. wherein the at least two other epoxy compounds comprise at least one mono-epoxy functional compound and at least one di- or poly-epoxy functional compound wherein the material has flexural modulus of less than 1100 MPa measured at –40° C. after thermal aging of 504 hours at 140° C. and a Tg of less than –40° C.

6. A flexible encapsulating material resulting from combining a two part reactive system wherein the first part comprises the following ingredients:

(a) at least one epoxy novolak resin; and (b) at least two other epoxy resins; and wherein the second part comprises at least one amine-terminated butadiene acryionitrile and wherein the material has a flexural modulus of less than 1100 MPa measured at –40° C. after thermal aging of 504 hours at 140° C. and a Tg of less than –40° C.

7. A material according to claim 6 wherein the material has a percent hardness change of less than 20% after thermal aging of 504 hours at 140° C.

8. A flexible encapsulating material resulting from a mixture comprising an epoxy novolak resin having less than 3 epoxy groups per molecule and at least one other epoxy resin and an amine terminated butadiene acrylonitrile.

9. A material according to claim 8 wherein the material has a percent hardness change of less than 20% after thermal aging of 504 hours at 140° C.

10. A composition comprising the following ingredients:
an epoxy novolak resin having less than 3 epoxy groups per molecule;
at least two other epoxy ingredients; and
an amine-terminated butadiene acrylonitrile.

11. A composition according to claim 1 wherein the epoxy novolak resin is present in an amount of 1 to 15 weight percent, based on the total amount of epoxy ingredients.

12. A composition according to claim 1 wherein the at least two other epoxy ingredients comprise at least one mono-epoxy functional compound and at least one di- or poly-epoxy functional compound.

13. A composition according to claim 10 wherein the composition is a liquid and contains 100% solids.

14. An electronic component encapsulated with a flexible material resulting from a mixture comprising an epoxy novolak resin and at least two other epoxy resins wherein the material has a percent hardness change of less than 20% after thermal aging of 504 hours at 140° C. and wherein the material has a flexural modulus of less than 1100 MPa measured at −40° C. after thermal aging of 504 hours at 140° C. and a Tq of less than −40° C.

15. An electronic component encapsulated with a flexible material resulting from combining a two part system in the absence of an amine hardener wherein a first part comprises the following ingredients:

an epoxy novolak resin; and
at least two other epoxy resins; and
wherein the second part comprises an amine-terminated butadiene acrylonitrile.

16. An electronic component encapsulated with a flexible material resulting from a mixture comprising an epoxy novolak resin having less than 3 epoxy groups per molecule and at least one other epoxy resin and an amine-terminated butadiene acrylonitrile.

17. A method for flexibly encapsulating an electronic component comprising applying to the component a mixture comprising an epoxy novolak resin having less than 3 epoxy groups per molecule and at least one other epoxy compound and an amine-terminated butadiene acrylonitrile.

18. A method according to claim 17 wherein the mixture comprises at two other epoxy compounds.

19. A method according to claim 17 wherein the epoxy novolak is present in an amount of an amount of 1 to 15 weight percent, based on the total amount of epoxy ingredients.

20. A method according to claim 17 wherein the mixture further comprises at least one amine hardener.

21. A method according to claim 17 further comprising allowing the mixture to cure.

22. A method according to claim 17 further comprising heating the mixture after application in order to accelerate curing.

* * * * *